(12) United States Patent
Suguro

(10) Patent No.: US 10,134,612 B2
(45) Date of Patent: Nov. 20, 2018

(54) SEMICONDUCTOR MANUFACTURING APPARATUS AND METHOD OF MANUFACTURING SEMICONDUCTOR DEVICE

(71) Applicant: TOSHIBA MEMORY CORPORATION, Tokyo (JP)

(72) Inventor: Kyoichi Suguro, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 622 days.

(21) Appl. No.: 14/467,406

(22) Filed: Aug. 25, 2014

(65) Prior Publication Data
US 2015/0235878 A1   Aug. 20, 2015

(30) Foreign Application Priority Data
Feb. 17, 2014   (JP) ................................. 2014-027479

(51) Int. Cl.
H01L 21/67 (2006.01)
H05B 6/80 (2006.01)
H01L 21/324 (2006.01)

(52) U.S. Cl.
CPC ...... H01L 21/67115 (2013.01); H01L 21/324 (2013.01); H01L 21/67248 (2013.01); H05B 6/80 (2013.01)

(58) Field of Classification Search
CPC ......... H01L 21/67115; H01L 21/67248; H01L 21/324
USPC .......................................... 438/795; 219/690
See application file for complete search history.

(56) References Cited

U.S. PATENT DOCUMENTS

| 6,172,322 B1 | 1/2001 | Shang et al. | |
| 2009/0321432 A1* | 12/2009 | Han | H05B 6/6408 219/761 |
| 2010/0307685 A1* | 12/2010 | Ota | C23C 16/511 156/345.33 |
| 2011/0014745 A1 | 1/2011 | Miyanaga | |
| 2014/0004690 A1 | 1/2014 | Isogai et al. | |
| 2014/0034636 A1* | 2/2014 | Yamamoto | H05B 6/6402 219/756 |

(Continued)

FOREIGN PATENT DOCUMENTS

| JP | 63-52421 | 3/1988 |
| JP | 2001-523038 | 11/2001 |

(Continued)

*Primary Examiner* — Moazzam Hossain
*Assistant Examiner* — Hajar Kolahdouzan
(74) *Attorney, Agent, or Firm* — Finnegan, Henderson, Farabow, Garrett & Dunner, L.L.P.

(57) ABSTRACT

In one embodiment, a semiconductor manufacturing apparatus includes a support module configured to support a wafer having first and second faces. The apparatus further includes a chamber configured to contain the support module. The apparatus further includes a microwave generator configured to generate a microwave. The apparatus further includes a waveguide configured to emit the microwave into the chamber to irradiate the first or second face of the wafer with the microwave, the waveguide being provided to the chamber such that an incidence direction of the microwave emitted from the waveguide onto the first or second face is non-vertical to the first or second face.

18 Claims, 5 Drawing Sheets

(56) References Cited

U.S. PATENT DOCUMENTS

2015/0147894 A1* 5/2015 Hamano ........... H01L 21/67115
　　　　　　　　　　　　　　　　　　　　　　　　438/795
2015/0222087 A1* 8/2015 Williams ................ C01B 31/06
　　　　　　　　　　　　　　　　　　　　　　　　428/64.1

FOREIGN PATENT DOCUMENTS

| JP | 2006-222211 | 8/2006 |
| JP | 2011-66254 | 3/2011 |

* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2014-27479, filed on Feb. 17, 2014, the entire contents of which are incorporated herein by reference.

FIELD

Embodiments described herein relate to a semiconductor manufacturing apparatus and a method of manufacturing a semiconductor device.

BACKGROUND

Due to shrink of a semiconductor device, decrease of a process temperature is required in various semiconductor manufacturing processes. Therefore, it is proposed to use a microwave to activate impurities, crystallize amorphous, and form metal silicide. However, when a wafer provided with a metal layer such as an electrode layer or an interconnect layer is irradiated with the microwave, a heating target region (a region which needs to be heated by the microwave) may not be sufficiently heated. The reason is that part of the microwave is absorbed or reflected by the metal layer. Therefore, power consumption for sufficiently heating the heating target region increases. Furthermore, uneven heating occurs between a portion including an electrode or interconnect and a portion without an electrode or interconnect, so that a wafer cannot be uniformly heated.

DETAILED DESCRIPTION

Embodiments will now be explained with reference to the accompanying drawings.

In one embodiment, a semiconductor manufacturing apparatus includes a support module configured to support a wafer having first and second faces. The apparatus further includes a chamber configured to contain the support module. The apparatus further includes a microwave generator configured to generate a microwave. The apparatus further includes a waveguide configured to emit the microwave into the chamber to irradiate the first or second face of the wafer with the microwave, the waveguide being provided to the chamber such that an incidence direction of the microwave emitted from the waveguide onto the first or second face is non-vertical to the first or second face.

(First Embodiment)

Figure 1:
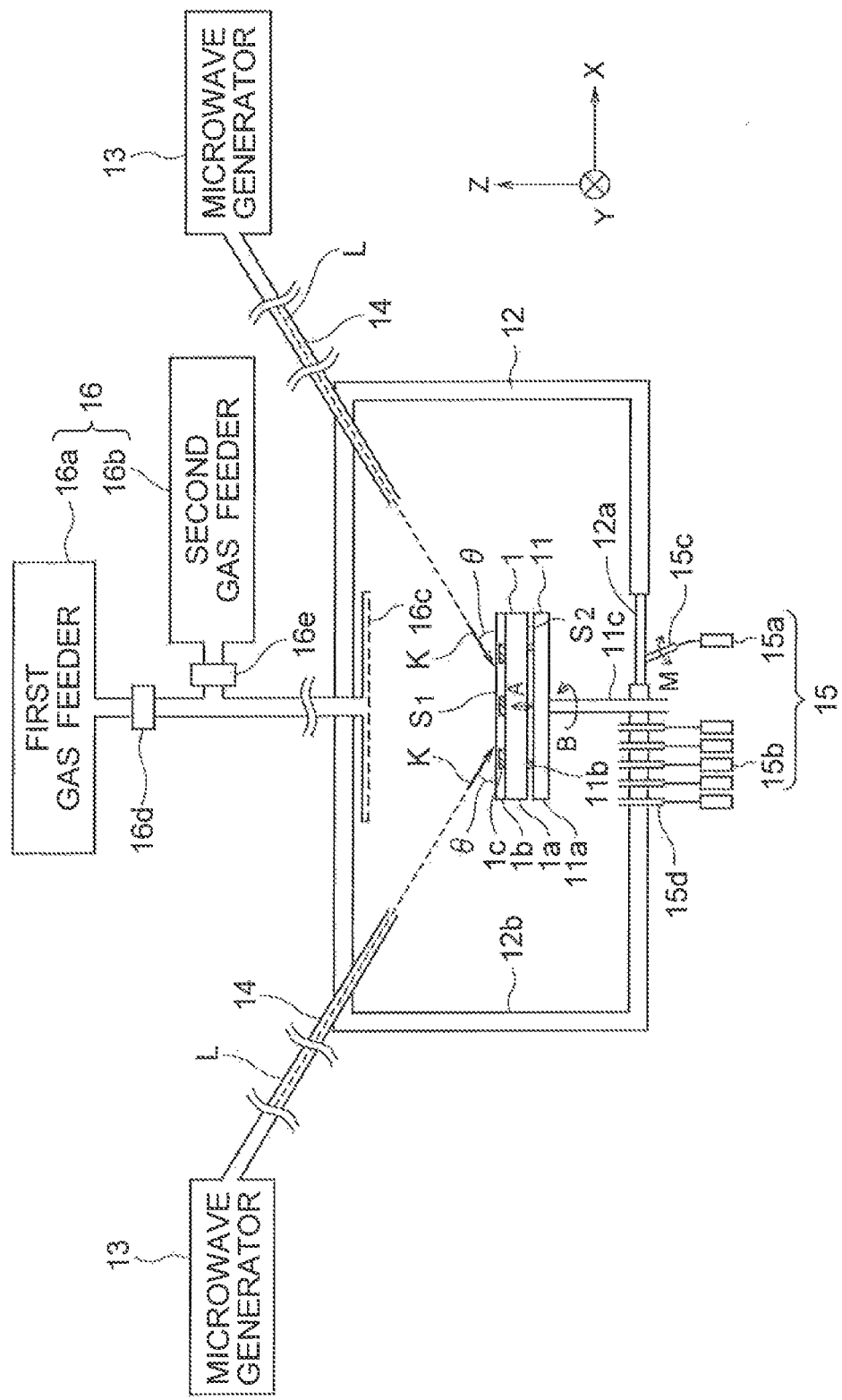
FIG. 1 is a cross-sectional view schematically illustrating a structure of a semiconductor manufacturing apparatus of a first embodiment.

FIG. 1 is a cross-sectional view schematically illustrating a structure of a semiconductor manufacturing apparatus of a first embodiment.

The semiconductor manufacturing apparatus in FIG. 1 includes a support module 11, a chamber 12, one or more microwave generators 13, one or more waveguides 14, one or more thermometers 15 and one or more gas feeders 16.

[Support Module 11]

The support module 11 is configured to support a wafer 1, and includes a quartz susceptor 11a, support pins 11b and a rotary shaft 11c. The quartz susceptor 11a is formed of quartz which is a transparent member. The support pins 11b project from a top face of the quartz susceptor 11a, and can lift and lower the wafer 1 in a vertical direction as indicated by an arrow A. The rotary shaft 11c is attached to a back face of the quartz susceptor 11a, and can rotate the wafer 1 in a horizontal plane as indicated by an arrow B.

The wafer 1 in FIG. 1 includes a substrate 1a, one or more workpiece layers 1b formed on the substrate 1a, and one or more metal layers 1c included in the workpiece layers 1b. An example of the substrate 1a is a semiconductor substrate such as a silicon (Si) substrate, a gallium nitride (GAN) substrate, a silicon carbide (SiC) substrate, a substrate obtained by growing a GaN layer on an Si substrate, or a substrate obtained by growing an SiC layer on an Si substrate. Examples of each workpiece layer 1b is an inter layer dielectric, an isolation insulator, an electrode layer and an interconnect layer. Examples of each metal layer 1c is an electrode layer including metal electrodes, and an interconnect layer including metal interconnects.

Reference sign "$S_1$" denotes a top face of the wafer 1, that is, a face of the wafer 1 on a workpiece layer 1b side. Reference sign "$S_2$" denotes a back face of the wafer 1, that is, a face of the wafer 1 on a substrate 1a side. The top face $S_1$ and the back face $S_2$ of the wafer 1 are examples of first and second faces, respectively. The wafer 1 of the present embodiment is disposed on the support module 11 such that the top face $S_1$ is directed upward and the back face $S_2$ is directed downward. The support module 11 of the present embodiment supports the back face $S_2$ of the wafer 1.

FIG. 1 illustrates X and Y directions which are parallel to the top face $S_1$ and the back face $S_2$ of the wafer 1 and are perpendicular to each other, and a Z direction which is perpendicular to the top face $S_1$ and the back face $S_2$ of the wafer 1. In this specification, the +Z direction is defined as an upper direction, and the −Z direction is defined as a lower direction. For example, a positional relationship between the substrate 1a and the workpiece layers 1b is expressed that the substrate 1a is positioned below the workpiece layers 1b.

[Chamber 12]

The chamber 12 contains the support module 11. In FIG. 1, the wafer 1 conveyed into the chamber 12 is disposed on the support module 11.

The chamber 12 includes a window 12a for measuring a temperature of the wafer 1 on the support module 11. The window 12a is formed of a transparent member such as quartz or sapphire.

The chamber 12 has an inner wall face 12b whose reflectivity of a microwave is 90% or more. The reflectivity of the microwave is a ratio of an intensity of the microwave vertically incident on the inner wall face 12b to an intensity of the microwave reflected by the inner wall face 12b. The reflectivity of 90% or more can be achieved by, for example, forming the inner wall face 12b using a material which reflects more microwaves and optically polishing the inner wall face 12b.

The inner wall face 12b of the chamber 12 of the present embodiment is formed of a material containing aluminum, such as pure aluminum or aluminum alloy. Furthermore, the inner wall face 12b of the chamber 12 of the present embodiment may be formed of a material which covers a surface of the pure aluminum or aluminum alloy and allows transmission of the microwave. An example of this material is a transparent insulator having a thickness of 100 μm or less. This transparent insulator is formed on the surface of the aluminum containing material which is an underlying layer of the transparent insulator. In the present embodiment, only a region of the inner wall face 12b of the chamber 12 which is in the vicinity of a lateral portion of the quartz susceptor 11a may be formed of the aluminum containing material and the transparent insulator. An advantage of such an inner wall face 12b will be described below.

[Microwave Generators 13]

The microwave generators 13 generate microwaves. A frequency of the microwaves may take any value and is desirably set to the following frequency range. The microwave generators 13 of the present embodiment generate the microwaves of a frequency band of 2.0 to 30.0 GHz and, more desirably, a frequency band of 2.45 to 24.125 GHz. For example, from a viewpoint of manufacturing cost and reliability of the microwave generators 13, the frequency of the microwaves is desirably a 2.45 GHz band, a 5.80 GHz band or a 24,125 GHz band which is an industry-science-medical (ISM) band. Furthermore, the frequency of the microwaves may be set to a frequency band of 5.80 to 14.0 GHz from a viewpoint of cost and reliability of a high power supply. An example of the microwave generators 13 is a magnetron.

[Waveguides 14]

The waveguides 14 emit the microwaves generated by the microwave generators 13 into the chamber 12 to irradiate the top face $S_1$ of the wafer 1 with the microwaves. Reference sign "K" denotes an incidence direction of the microwaves emitted from the waveguides 14 onto the top face $S_1$ of the wafer 1. The waveguides 14 are attached to the chamber 12 such that this incidence direction K is non-vertical to the top face $S_1$ of the wafer 1. The waveguides 14 may be directly attached to the chamber 12 or may be indirectly attached to the chamber 12 via another member.

Reference sign "L" denotes a center axis of each waveguide 14. The center axis L of the present embodiment is set parallel to the K direction. As a result, the microwaves emitted from the waveguides 14 of the present embodiment are incident onto the top face $S_1$ of the wafer 1 from the K direction. Although the emission direction and the incidence direction of the microwaves are set to the same direction in the present embodiment, the emission direction and the incidence direction of the microwaves may be set to different directions.

Reference sign "θ" denotes an incidence angle of the microwaves emitted from the waveguides 14 onto the top face $S_1$ of the wafer 1. Therefore, reference sign "θ" denotes an angle of the K direction with respect to the top face $S_1$ of the wafer 1. The incidence angle "θ" takes a value satisfying, for example, 0°<"θ"<60° and more desirably, 55 degrees or less ("θ"≤55°). More specifically, the incidence angle "θ" of the present embodiment is set to a value satisfying 0°<"θ"≤30°, and for example, is set to a value satisfying 0°<"θ"≤10°. Therefore, the microwaves are incident onto the top face $S_1$ of the wafer 1 of the present embodiment from a direction nearly parallel to the top face $S_1$, and more specifically, a direction of a glancing angle whose incidence angle "θ" is 30 degrees or less.

[Thermometers 15]

The thermometers 15 measure the temperature of the wafer 1 and output measurement results of the temperature. The thermometers 15 of the present embodiment are radiation thermometers which can receive and measure electromagnetic waves of one wavelength or two wavelengths. Therefore, the thermometers 15 of the present embodiment measure the temperature of the wafer 1 by measuring the electromagnetic waves radiated from the wafer 1. The measurement results of the temperature by the thermometers 15 are used to control the positions of the support pins 11b (A), rotation of the rotary shaft 11c (B), operations of the microwave generators 13, and operations of the gas feeders 16.

The thermometers 15 of the present embodiment measure an intensity of light which is radiated from the back face $S_2$ of the wafer 1 by irradiating the top face $S_1$ of the wafer 1 with the microwaves, in a range of a wavelength of 900 to 2000 nm. The thermometers 15 of the present embodiment measure the light having a wavelength to which it is most sensitive depending on a temperature region of the wafer 1. When the temperature is measured in a low temperature region of 500° C. or less, it is desirable to reduce noise on the light to enhance measurement accuracy.

The thermometer 15 of the present embodiment includes at least one first thermometer 15a and at least one second thermometer 15b. The first thermometer 15a includes, near the window 12a, an optical fiber 15c whose angle can be varied in an M direction. The first thermometer 15a measures the temperature of the wafer 1 by measuring the electromagnetic waves radiated from the wafer 1 through the window 12a and the optical fiber 15c. The second thermometer 15b includes an optical fiber 15d which passes through a wall of the chamber 12. The second thermometer 15b measures the temperature of the wafer 1 by measuring the electromagnetic waves radiated from the wafer 1 through the optical fiber 15d.

The thermometers 15 of the present embodiment measure temperatures at two or more different portions of the wafer 1. The thermometers 15 measure the temperatures near a center portion and an edge portion of the wafer 1. Furthermore, the thermometers 15 may measure the temperatures of portions between the center portion and the end portion of the wafer 1. The thermometers 15 in FIG. 1 measure the temperatures at five portions of the wafer 1 using the five second thermometers 15b.

[Gas Feeders 16]

The gas feeders 16 includes a first gas feeder 16a which mainly feeds a cooling gas for cooling the wafer 1, and a second gas feeder 16b which mainly feeds a process gas for processing the wafer 1. The first and second gas feeders 16a and 16b includes a shared spray nozzle 16c which sprays the cooling gas and the process gas to the wafer 1 on the support module 11. The spray nozzle 16c has a plurality of openings, and can uniformly spray the cooling gas and the process gas on the entire top face $S_1$ of the wafer 1 by spraying these gases to the wafer 1 like a shower.

The first gas feeder 16a feeds an inert gas, for example, at least one or more gases selected from an argon (Ar) gas, a neon (Ne) gas, a helium (He) gas, a xenon (Xe) gas and a nitrogen ($N_2$) gas through a first mass flow controller 16d.

Meanwhile, the second gas feeder 16b feeds at least one or more gases selected from the Ar gas, the He gas, the $N_2$ gas, an oxygen ($O_2$) gas, a hydrogen ($H_2$) gas and a water ($H_2O$) gas through a second mass flow controller 16e.

The gas feeders 16 of the present embodiment may feed the same gas from the first and second gas feeders 16a and 16b to increase a total flow rate of the feed gas.

In the present embodiment, the maximum flow rate of the first mass flow controller 16d is designed to be higher than the maximum flow rate of the second mass flow controller 16e. Therefore, the first and second mass flow controllers 16d and 16e operate to set the flow rate of the gas from the first gas feeder 16a higher than the flow rate of the gas from the second gas feeder 16b in many cases.

(1) Details of Semiconductor Manufacturing Apparatus of First Embodiment

Details of the semiconductor manufacturing apparatus of the first embodiment will be described with reference to FIG. 1.

A general semiconductor manufacturing apparatus is configured such that the incidence direction K of the microwaves emitted from the waveguides 14 onto the top face $S_1$ of the wafer 1 are vertical to the top face $S_1$. Therefore, the microwaves emitted from the waveguides 14 are incident onto the top face $S_1$ of the wafer 1 from the −Z direction, and are reflected by the top face $S_1$ of the wafer 1. mainly in the +Z direction, The microwaves reflected in the +Z direction reach an upper region in the chamber 12. In general, multiple devices are arranged in the upper region above the wafer 1 in the chamber 12. Therefore, the microwaves reaching the upper region in the chamber 12 are reflected in various directions. Therefore, most of the microwaves reaching the upper region in the chamber 12 are not irradiated on the wafer 1 again.

Meanwhile, the semiconductor manufacturing apparatus of the present embodiment is configured such that the incidence direction K of the microwaves emitted from the waveguides 14 onto the top face $S_1$ of the wafer 1 are non-vertical to the top face $S_1$. Therefore, the microwaves reflected by the top face $S_1$ of the wafer 1 reach mainly a side region in the chamber 12. In general, devices are hardly arranged in the side region of the chamber 12. Therefore, most of the microwaves reaching the side region in the chamber 12 of the present embodiment can be then reflected repeatedly by the inner wall face 12b of the chamber 12. Consequently, most of the microwaves reaching the side region in the chamber 12 of the present embodiment can be irradiated on the wafer 1 again.

Therefore, the present embodiment makes it possible to sufficiently heat a heating target region of the wafer 1 with little power consumption by repeatedly irradiating the wafer 1 with the same microwave, even when the wafer 1 includes the metal layers 1c.

Furthermore, the present embodiment makes it possible to uniformly heat the wafer 1 because various regions of the wafer 1 are irradiated with the microwaves from various directions.

In addition, the chamber 12 of the present embodiment has the inner wall face 12b whose reflectivity of microwave is 90% or more. Therefore, when the microwaves are reflected by the inner wall face 12b of the chamber 12, energy of the microwaves is hardly lost. For example, when the microwaves vertically incident onto the inner wall face 12b of the chamber 12 are reflected by the inner wall face 12b of the chamber 12, the amount of loss of the energy of the microwaves is less than 10%. Therefore, the present embodiment makes it possible to suppress the loss of the energy of the microwaves and repeatedly irradiate the wafer 1 with the same microwave.

It is noted that positions, angles and shapes of the waveguides 14 of the present embodiment are desirably designed such that the microwaves emitted from each waveguide 14 do not return to the same waveguide 14 again or to another waveguide 14.

(2) Method of Manufacturing Semiconductor Device of First Embodiment

Figure 2:
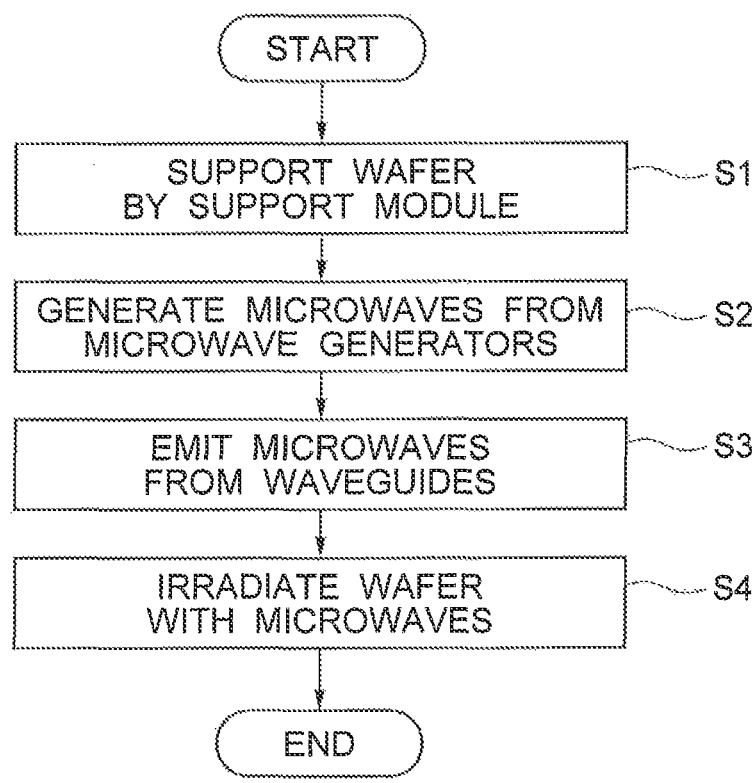
FIG. 2 is a flowchart illustrating a method of manufacturing a semiconductor device of the first embodiment.

FIG. 2 is a flowchart illustrating a method of manufacturing the semiconductor device of the first embodiment.

First, the wafer 1 is conveyed into the chamber 12, and the wafer 1 is supported by the support module 11 (step S1). At this time, the wafer 1 is supported by the support module 11 such that the top face $S_1$ is directed upward and the back face $S_2$ is directed downward.

Next, the microwave generators 13 generate the microwaves (step S2). The waveguides 14 then emit the microwaves into the chamber 12 (step S3). The waveguides 14 are attached to the chamber 12 such that the incidence direction K of the microwaves onto the top face $S_1$ of the wafer 1 is non-vertical to the top face $S_1$. When the waveguides 14 emit the microwaves, the top face $S_1$ of the wafer 1 is irradiated with the microwaves, and the wafer 1 is annealed by heat of the microwaves (step S4).

For example, this annealing is performed to activate impurities, repair defects upon ion implantation, crystallize amorphous, or form metal silicide. In these cases, the heating target region of the wafer 1 is a region in which impurities to be activated are implanted, a region in which defects are formed upon the ion implantation, a region in which an amorphous layer to be crystallized is formed, or a region in which a metal silicide layer is to be formed.

During processing in steps S2 to S4, the wafer 1 may be rotated by rotating the rotary shaft 11c. This makes it possible to more uniformly heat the wafer 1. During the processing in steps S2 to S4, the temperature of the wafer 1 may be measured by the thermometers 15, and the wafer 1 may be cooled by the gas feeders 16.

As described above, the waveguides 14 of the present embodiment are provided to the chamber 12 such that the incidence direction K of the microwaves onto the top face $S_1$ of the wafer 1 is non-vertical to the top face $S_1$. More specifically, the incidence angle "θ" of the microwaves of the present embodiment is set to 30 degrees or less. Therefore, the present embodiment makes it possible to efficiently heat the heating target region of the wafer 1 when the wafer 1 (e.g., a semiconductor layer, an insulating layer, an interface between a semiconductor layer and an insulating layer, or a metal layer of the wafer 1) is heated with the microwaves.

The incidence angle "θ" of the microwaves of the present embodiment may be set higher than 30 degrees as long as the incidence direction K of the microwaves is non-vertical to the Z direction. However, it is possible in the present embodiment to set the incidence direction K to a direction nearly parallel to the top face $S_1$ of the wafer 1 by setting the incidence angle "θ" to 30 degrees or less. As a result, the present embodiment makes it possible to cause most of the microwaves reflected by the top face $S_1$ of the wafer 1 to travel to the side region of the wafer 1, not to the upper region of the chamber 12.

The wafer 1 of the present embodiment may be disposed on the support module 11 such that the top face $S_1$ is directed downward and the back face $S_2$ is directed upward. For example, the wafer 1 may be disposed in this way when electrode patterns or interconnect patterns of a high density are formed on the top face $S_1$ side of the wafer 1, or when impurities are introduced on the back face $S_2$ side of the wafer 1 by ion implantation or plasma doping. In these cases, the top face $S_1$ and the back face $S_2$ of the wafer 1 are examples of the second and first faces respectively, and the back face $S_2$ of the wafer 1 is irradiated with microwaves.

(Second Embodiment)

Figure 3:
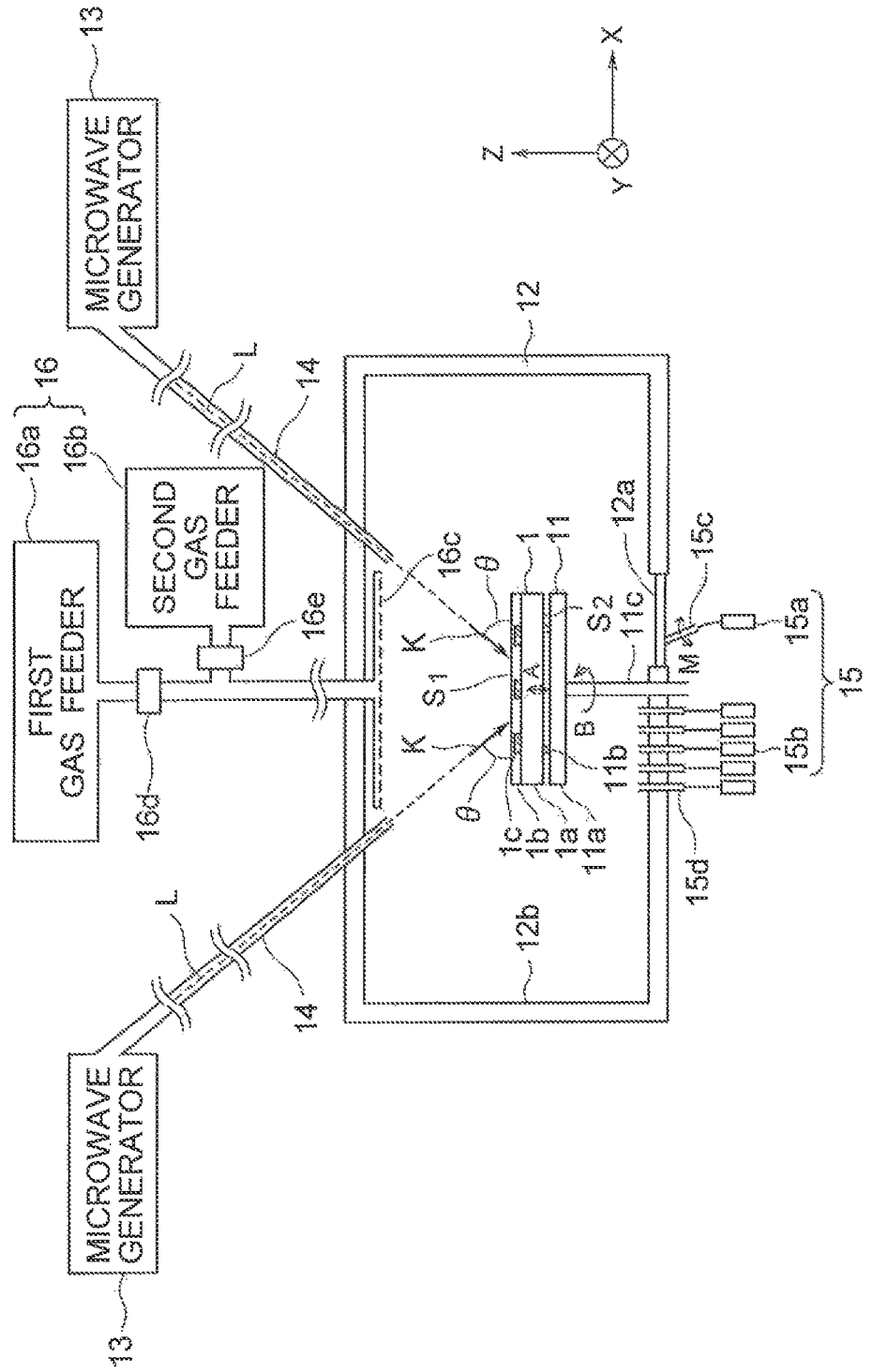
FIG. 3 is a cross-sectional view schematically illustrating a structure of a semiconductor manufacturing apparatus of a second embodiment.
Figure 4A:
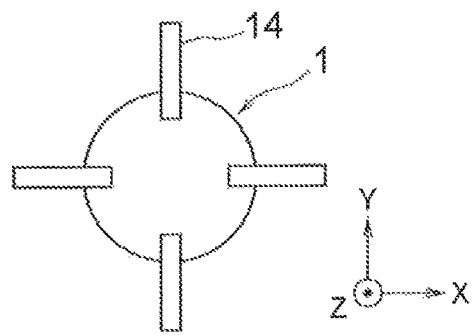
FIGS. 4A to 4F are plan views schematically illustrating structures of the semiconductor manufacturing apparatus of various modifications of the first or second embodiment.
Figure 4B:
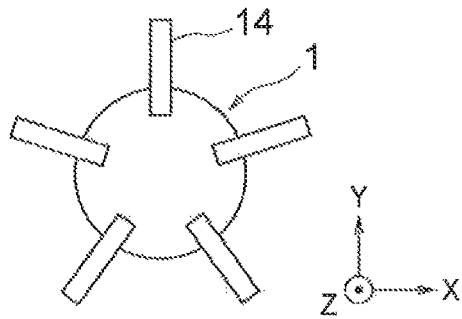
Figure 4C:
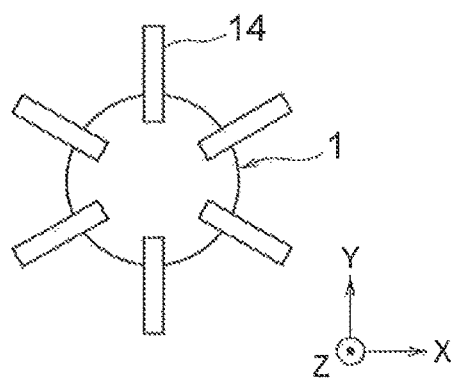
Figure 4D:
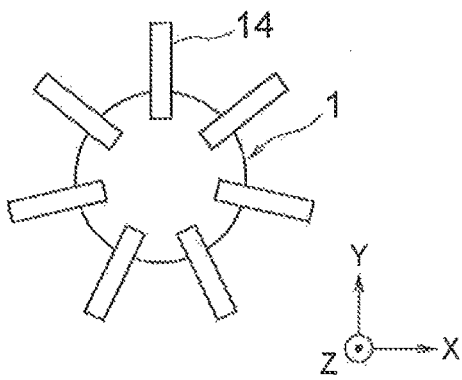
Figure 4E:
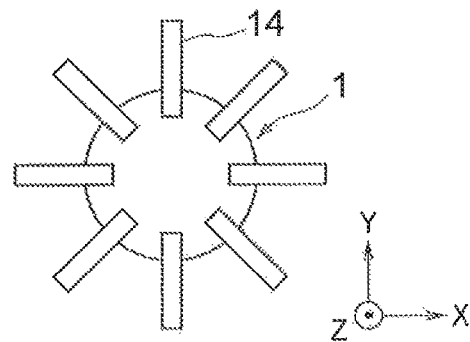
Figure 4F:
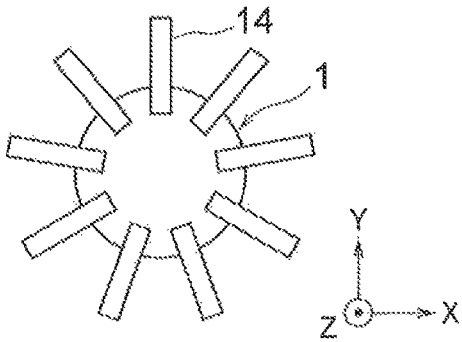

FIG. 3 is a cross-sectional view schematically illustrating a structure of a semiconductor manufacturing apparatus of a second embodiment.

As similar to the semiconductor manufacturing apparatus in FIG. 1, a semiconductor manufacturing apparatus in FIG. 3 includes a support module 11, a chamber 12, one or more microwave generators 13, one or more waveguides 14, one or more thermometers 15 and one or more gas feeders 16.

An incidence angle "θ" of the microwaves of the present embodiment is 45 to 55 degrees (45°≤"θ"≤55°). Therefore, the microwaves of the present embodiment are incident onto the top face $S_1$ of the wafer 1 from a direction diagonal to the top face $S_1$.

As similar to the first embodiment, an incidence direction K of the microwaves of the present embodiment is non-vertical to the Z direction, so that it is possible to repeatedly irradiate the wafer 1 with the same microwave. As a result, the present embodiment makes it possible to sufficiently heat the heating target region of the wafer 1 with little power consumption.

In the present embodiment, since it is possible to repeatedly irradiate the wafer 1 with the same microwave as similar to the first embodiment, the wafer 1 can be irradiated with the microwaves from various directions. As a result, the present embodiment makes it possible to uniformly heat the wafer 1.

It is noted that the positions, angles and shapes of the waveguides 14 of the present embodiment are desirably designed such that the microwaves emitted from each waveguide 14 does not return to the same waveguide 14 again or to another waveguide 14. In the present embodiment, it is easy to achieve such a design because the positions of the waveguides 14 with respect to the wafer 1 are in the direction diagonal to the wafer 1, not in the direction nearly parallel to the wafer 1 (glancing angle direction).

Hereinafter, the incidence angle "θ" to minimize a ratio of an incidence intensity "I" to a reflection intensity "R" of the microwaves at the top face $S_1$ of the wafer 1 ("R/I") is referred to a minimum reflection incidence angle "$θ_0$" of the wafer 1. The incidence angle "θ" of the microwaves of the present embodiment is desirably set such that a magnitude of a difference between the incidence angle "θ" of the microwaves and the minimum reflection incidence angle "$θ_0$" of the wafer 1 is 5 degrees or less. In other words, the incidence angle "θ" of the microwaves is desirably set to an angle close to the minimum reflection incidence angle "$θ_0$" of the wafer 1. For example, when the minimum reflection incidence angle "$θ_0$" of the wafer 1 is 50 degrees, the incidence angle "θ" of the microwaves is desirably set to 45 to 55 degrees.

It is possible in the present embodiment, by setting the incidence angle "θ" of the microwaves to the angle close to the minimum reflection incidence angle "$θ_0$", to absorb most of the microwaves in the wafer 1. As a result, the present embodiment makes it possible to more efficiently heat the wafer 1.

As described above, the waveguides 14 of the present embodiment are provided to the chamber 12 such that the incidence direction K of the microwaves on the top face $S_1$ of the wafer 1 is non-vertical to the top face $S_1$. More specifically, the incidence angle "θ" of the microwaves of the present embodiment is set to 45 to 55 degrees (45°≤"θ"≤55°). Therefore, the present embodiment makes it possible to efficiently heat the heating target region of the wafer 1 when the wafer 1 is heated with the microwaves.

It was found that when the wafer 1 was heated with the microwaves using the semiconductor manufacturing apparatus of the first or second embodiment, the time required to raise the temperature of the wafer 1 from a room temperature to 600° C. was less than half the time required when a general semiconductor manufacturing apparatus was used.

(Modifications of First and Second Embodiments)

FIGS. 4A to 4F are plan views schematically illustrating structures of the semiconductor manufacturing apparatus of various modifications of the first or second embodiment.

Each semiconductor manufacturing apparatus in FIGS. 4A to 4F includes N waveguides 14 where N is an integer of two or more. More specifically, the semiconductor manufacturing apparatuses in FIGS. 4A to 4F respectively include four to nine waveguides 14. In each of FIGS. 4A to 4F, the N waveguides 14 are arranged at equal intervals.

Figure 5:
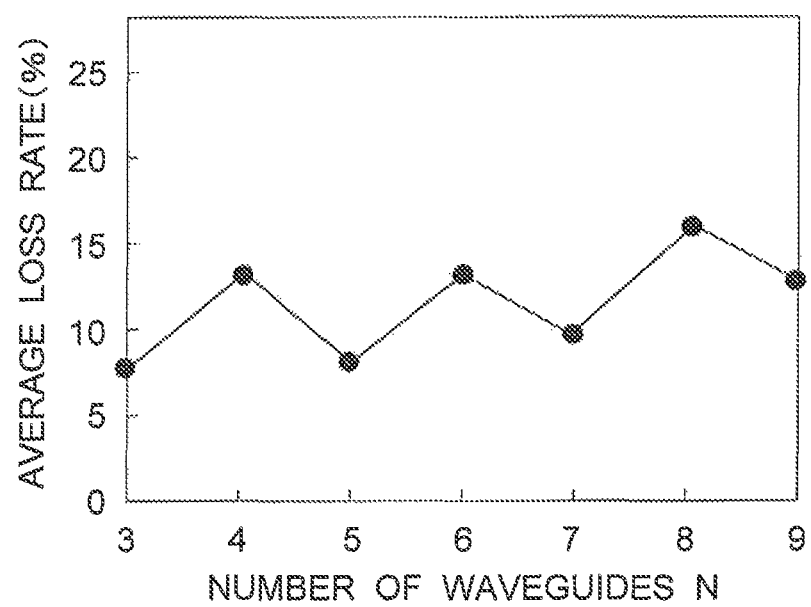
FIG. 5 is a graph illustrating an example of a relationship between the number of waveguides and an average loss rate of energy of microwaves in the various modifications of the first or second embodiment.

FIG. 5 is a graph illustrating an example of a relationship between the number of the waveguides 14 and an average loss rate of energy of the microwaves in the various modifications of the first or second embodiment. For example, when the number of the waveguides 14 in FIG. 5 is five, about 8% of the energy of the microwaves is lost every time that the microwaves are reflected once by the inner wall face 12b of the chamber 12.

In FIG. 5, the average loss rate in cases where the number of the waveguides 14 is odd is lower than the average loss rate in cases where the number of the waveguides 14 is even. The reason is that when the number of the waveguides 14 is even, the microwaves emitted from each waveguide 14 often return to the same waveguide 14 again or to another waveguide 14, so that the energy is likely to be significantly lost.

Therefore, the number of the waveguides 14 of the first and second embodiments is desirably set to an odd number of three or more. This makes is possible to efficiently irradiate the wafer 1 with the microwaves from the microwave generators 13. As a result, it is possible to use the microwave generators 13 of less power consumption to achieve reduction in power consumption of the semiconductor manufacturing apparatus and reduction in manufacturing cost of the semiconductor device.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a support module configured to support a wafer having first and second faces;
   a chamber configured to contain the support module;
   a microwave generator configured to generate a microwave; and
   a waveguide configured to emit the microwave into the chamber to irradiate the first or second face of the wafer with the microwave, the waveguide being provided to the chamber such that an incidence direction of the microwave emitted from the waveguide onto the first or second face is non-vertical to the first or second face, wherein the apparatus is configured such that the microwave emitted from the waveguide is incident from the waveguide onto the wafer and reflected by the wafer, and at least a portion of the microwave reflected by the wafer reaches an inner side wall of the chamber, is reflected by the inner side wall of the chamber, and is incident onto the wafer again, the whole inner side wall of the chamber is capable of reflecting the microwave, and the chamber has an inner wall face formed of a first material that allows transmission of the microwave, the first material being provided on a surface of a second material containing aluminum which is an underlying layer of the first material.

2. The apparatus of claim 1, wherein an incidence angle of the microwave emitted from the waveguide onto the first or second face is larger than 0degree, and equal to or smaller than 30 degrees.

3. The apparatus of claim 1, wherein an incidence angle of the microwave emitted from the waveguide onto the first or second face is equal to or larger than 45 degrees, and equal to or smaller than 55 degrees.

4. The apparatus of claim 1, wherein the wafer includes a substrate and a workpiece layer on the substrate, the first face being located on a side of the workpiece layer of the wafer, and the second face being located on a side of the substrate of the wafer, and the waveguide irradiates the first face of the wafer with the microwave.

5. The apparatus of claim 1, wherein the chamber includes a window for measuring a temperature of the wafer on the support module.

6. The apparatus of claim 5, further comprising:

a first thermometer configured to measure the temperature of the wafer through the window; and a second thermometer configured to measure the temperature of the wafer without using the window.

7. The apparatus of claim 1, further comprising:

a first gas feeder configured to feed a first gas;

a second gas feeder configured to feed a second gas; and a nozzle configured to feed the first and second gases to the wafer on the support module.

8. The apparatus of claim 1, wherein a number of the waveguides is an odd number.

9. The apparatus of claim 1, further comprising:

a cooling gas feeder configured to feed a cooling gas; and a nozzle provided above the support module and configured to feed the cooling gas to the wafer on the support module.

10. The apparatus of claim 1, wherein a portion of the waveguide protrudes into the chamber.

11. A method of manufacturing a semiconductor device, comprising:

supporting a wafer having first and second faces by a support module in a chamber;

generating a microwave from a microwave generator; and emitting the microwave into the chamber from a waveguide provided to the chamber to irradiate the first or second face of the wafer with the microwave, wherein the waveguide is provided to the chamber such that an incidence direction of the microwave emitted from the waveguide onto the first or second face is non-vertical to the first or second face, and the microwave emitted from the waveguide is incident from the waveguide onto the wafer and reflected by the wafer, and at least a portion of the microwave reflected by the wafer reaches an inner side wall of the chamber, is reflected by an inner side wall of the chamber, and is incident onto the wafer again, the whole inner side wall of the chamber is capable of reflecting the microwave, and the chamber has an inner wall face formed of a first material that allows transmission of the microwave, the first material being provided on a surface of a second material containing aluminum which is an underlying layer of the first material.

12. The method of claim 11, wherein an incidence angle of the microwave emitted from the waveguide onto the first or second face is larger than 0degree, and equal to or smaller than 30 degrees.

13. The method of claim 11, wherein an incidence angle of the microwave emitted from the waveguide onto the first or second face is equal to or larger than 45 degrees, and equal to or smaller than 55 degrees.

14. The method of claim 11, wherein a magnitude of a difference between an incidence angle of the microwave emitted from the waveguide onto the first or second face and a minimum reflection incidence angle that is an incidence angle to minimize a ratio of an incidence intensity to a reflection intensity of the microwave at the wafer is 5 degrees or less.

15. The method of claim 11, wherein the wafer includes a substrate and a workpiece layer on the substrate, the first face being located on a side of the workpiece layer of the wafer, and the second face being located on a side of the substrate of the wafer, and the waveguide irradiates the first face of the wafer with the microwave.

16. A semiconductor manufacturing apparatus comprising:

a support module configured to support a wafer having first and second faces;

a chamber configured to contain the support module;

a plurality of microwave generators configured to generate microwaves; and a plurality of waveguides configured to emit the microwaves into the chamber to irradiate the first or second face of the wafer with the microwaves, the waveguides being provided to the chamber such that incidence directions of the microwaves emitted from the waveguides onto the first or second face are non-vertical to the first or second face, wherein the apparatus is configured such that the microwaves emitted from the waveguides are incident from the waveguides onto the wafer and reflected by the wafer, and at least a portion of the microwaves reflected by the wafer reaches an inner side wall of the chamber, is reflected by the inner side wall of the chamber, and is incident onto the wafer again, the whole inner side wall of the chamber is capable of reflecting the microwave, and the chamber has an inner wall face formed of a first material that allows transmission of the microwave, the first material being provided on a surface of a second material containing aluminum which is an underlying layer of the first material.

17. The apparatus of claim 16, wherein the plurality of waveguides include three or more waveguides arranged at equal intervals.

18. The apparatus of claim 16, wherein the plurality of waveguides include odd waveguides arranged at equal intervals.

* * * * *